United States Patent
Katsube et al.

(10) Patent No.: US 9,472,351 B2
(45) Date of Patent: Oct. 18, 2016

(54) SOLID ELECTROLYTIC CAPACITOR, ELECTRONIC COMPONENT MODULE, METHOD FOR PRODUCING SOLID ELECTROLYTIC CAPACITOR AND METHOD FOR PRODUCING ELECTRONIC COMPONENT MODULE

(71) Applicant: MURATA MANUFACTURING CO., LTD., Nagaokakyo-shi, Kyoto-Fu (JP)

(72) Inventors: Akio Katsube, Nagaokakyo (JP); Hiroki Kitayama, Nagaokakyo (JP); Shinji Otani, Nagaokakyo (JP); Koji Murata, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 122 days.

(21) Appl. No.: 14/591,068

(22) Filed: Jan. 7, 2015

(65) Prior Publication Data
US 2015/0194270 A1    Jul. 9, 2015

(30) Foreign Application Priority Data
Jan. 9, 2014   (JP) ................ 2014-002420

(51) Int. Cl.
*H01G 4/228* (2006.01)
*H01G 9/15* (2006.01)
*H01G 9/012* (2006.01)
*H01G 9/00* (2006.01)
(Continued)

(52) U.S. Cl.
CPC .............. *H01G 9/15* (2013.01); *H01G 9/0032* (2013.01); *H01G 9/012* (2013.01); *H01G 9/14* (2013.01); *H05K 3/3426* (2013.01); *H05K 3/3494* (2013.01); *H01G 9/042* (2013.01); *H05K 1/181* (2013.01); *H05K 2201/10015* (2013.01); *Y02P 70/613* (2015.11); *Y10T 29/417* (2015.01); *Y10T 29/49144* (2015.01)

(58) Field of Classification Search
CPC ........ H01G 4/30; H01G 4/224; H01G 4/228; H01G 4/232; H01G 2/12; H01G 9/10; H01G 9/15; H01G 9/012; H01G 9/042; H01G 9/0032; H05K 1/181; H05K 3/3426; H05K 3/3494; H05K 2201/10015
See application file for complete search history.

(56) References Cited

U.S. PATENT DOCUMENTS 6,680,841 B2 *   1/2004   Tadanobu .............. H01G 9/012
                                                        29/25.03
6,791,822 B2 *   9/2004   Kochi .................... H01G 9/012
                                                        29/25.03
(Continued)

FOREIGN PATENT DOCUMENTS

JP    2003-100980 A    4/2003
JP    2003-124074 A    4/2003
(Continued)

*Primary Examiner* — Hoa C Nguyen
(74) *Attorney, Agent, or Firm* — Arent Fox LLP (57) ABSTRACT

A solid electrolytic capacitor that includes a capacitor element; an exterior resin; an anode lead terminal; and a cathode lead terminal. The anode lead terminal has a Cu base material, and an Au-plating layer formed thereon, and includes an Au region where the Au-plating layer as a surface layer is formed, and a Cu region where the Au-plating layer is not formed. The cathode lead terminal includes a base material, and an Au-plating layer as a surface layer of the cathode lead terminal, which is formed on the base material, and an anode section of the capacitor element is connected to the Cu region of the anode lead terminal.

16 Claims, 9 Drawing Sheets

(51) Int. Cl.
    *H05K 3/34*         (2006.01)
    *H01G 9/14*         (2006.01)
    *H01G 9/042*       (2006.01)
    *H05K 1/18*         (2006.01)

(56) References Cited

U.S. PATENT DOCUMENTS

| | | | |
|---|---|---|---|
| 7,098,081 B2 | 8/2006 | Sakakibara et al. | |
| 7,773,367 B1 * | 8/2010 | Knowles | H01G 9/022 |
| | | | 361/523 |
| 7,821,772 B2 * | 10/2010 | Kobayashi | H01G 9/0036 |
| | | | 361/524 |
| 8,035,953 B2 * | 10/2011 | Nemoto | H01G 9/0425 |
| | | | 29/25.03 |
| 2011/0149477 A1 * | 6/2011 | Summey | H01G 9/0029 |
| | | | 361/528 |
| 2012/0147520 A1 * | 6/2012 | Liu | H01G 4/005 |
| | | | 361/311 |
| 2012/0250227 A1 * | 10/2012 | Mitsuyama | H01G 9/0032 |
| | | | 361/529 |
| 2014/0268500 A1 * | 9/2014 | Chen | H01G 9/151 |
| | | | 361/523 |

FOREIGN PATENT DOCUMENTS

| | | |
|---|---|---|
| JP | 2010-067876 A | 3/2010 |
| WO | WO-2006/118144 A1 | 11/2006 |

* cited by examiner

PRIOR ART

SOLID ELECTROLYTIC CAPACITOR, ELECTRONIC COMPONENT MODULE, METHOD FOR PRODUCING SOLID ELECTROLYTIC CAPACITOR AND METHOD FOR PRODUCING ELECTRONIC COMPONENT MODULE

BACKGROUND OF THE INVENTION

1. Field of the Invention

The present invention relates to a solid electrolytic capacitor, an electronic component module including a solid electrolytic capacitor, a method for producing a solid electrolytic capacitor, and a method for producing an electronic component module. Particularly, the present invention relates to an anode lead terminal of a solid electrolyte capacitor.

2. Description of the Related Art

Figure 9:
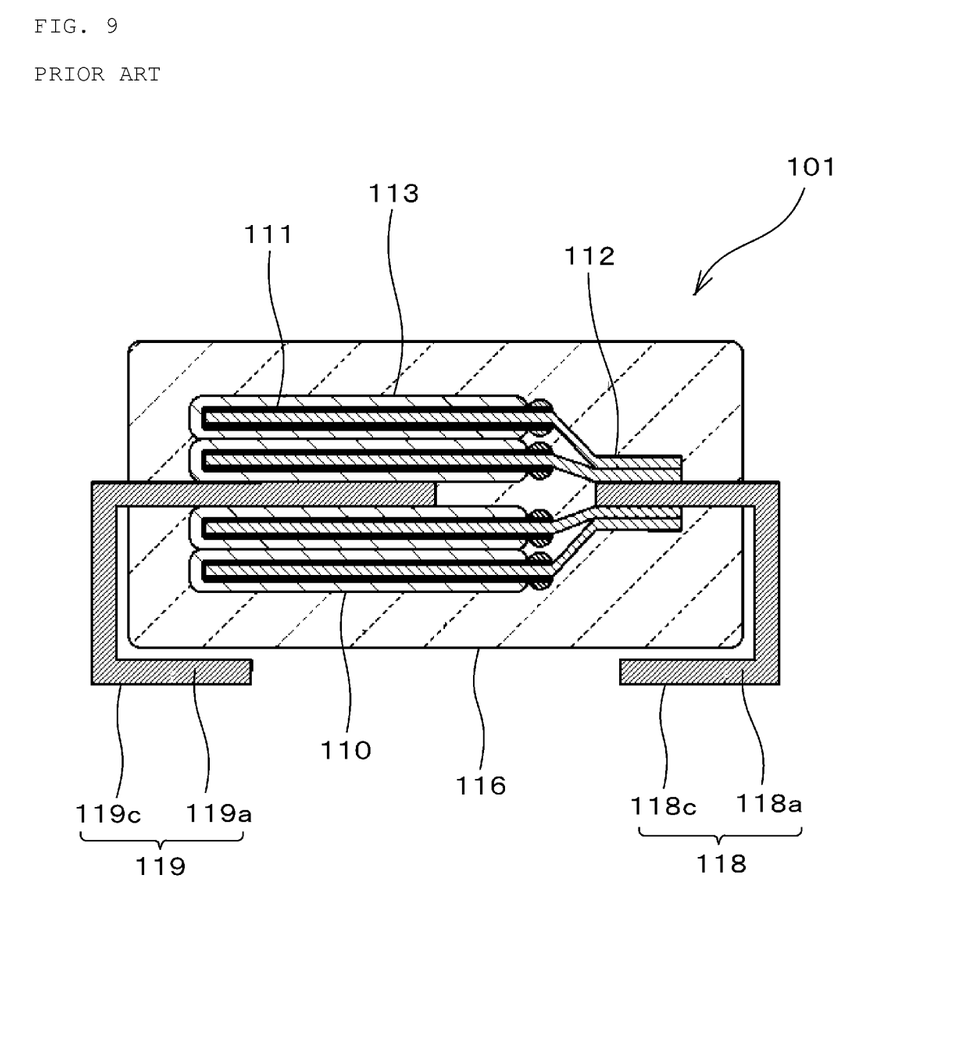
FIG. 9 is a sectional view of a solid electrolytic capacitor according to the background art.

As shown in FIG. 9, a known solid electrolytic capacitor 1 includes: a plurality of capacitor elements 110 each having a dielectric material section 111, an anode section 112 and a cathode section 113; an anode lead terminal 118 connected to the anode section 112; a cathode lead terminal 119 connected to the cathode section 113; and an exterior resin 116 covering the plurality of capacitor elements 110. As the anode lead terminal 118 and the cathode lead terminal 119, articles obtained by applying Sn-platings 118c and 119c to base materials 118a and 119a formed of a Fe—Ni-based alloy or a Cu-based alloy are used.

However, in reflow soldering, the operation temperature of which is 235° C. to 260° C., the problem occurs that Sn-platings 118c and 119c of the anode lead terminal 118 and the cathode lead terminal 119 are melted to generate gaps between the lead terminals and the exterior resin 116, so that air tightness is impaired. As a countermeasure thereto, it is conceivable that as a plating material, a high-melting-point metal (melting point: 400° C. or higher) such as, for example, Ni (melting point: 1450° C.) or Au (melting point: 1064° C.) is used rather than using a low-melting-point metal such as Sn (melting point: 232° C.)

Japanese Patent Laid-open Publication No. 2003-124074 describes that for reducing a region of a plating layer with a high-melting-point metal, an Au-plating layer is formed on only one surface of the anode lead terminal 118, and the anode section 112 of the capacitor element 110 is resistance-welded to the Au-plating layer.

However, in combination of Au that is a material of an Au-plating layer formed on the anode lead terminal 118 and aluminum that is a material of the anode section 112 of the capacitor element 110, the electric resistance during resistance welding is too low to generate heat, so that it is difficult to bond the anode lead terminal 118 and the capacitor element 110 to each other.

SUMMARY OF THE INVENTION

An object of the present invention is to provide a solid electrolytic capacitor having a structure capable of reliably bonding an anode section of a capacitor element and an anode lead terminal to each other although a material that is not melted at a reflow temperature is used as a plating material for the anode lead terminal, and a method for producing the solid electrolytic capacitor. Further, an object of the present invention is to provide an electronic component module including the solid electrolytic capacitor of the present invention, and a method for producing the electronic component module.

For achieving the objects described above, a solid electrolytic capacitor according to the present invention includes a laminate formed by laminating a plurality of capacitor elements each having an anode section, a dielectric material layer disposed on the anode section, and a cathode section disposed on the dielectric material layer, so as to electrically connect the anode sections to one another and electrically connect the cathode sections to one another. An exterior resin is formed so as to cover the laminate. An anode lead terminal is electrically connected to the anode section of the capacitor element and drawn to the outside of the exterior resin, and a cathode lead terminal is electrically connected to the cathode section of the capacitor element and drawn to the outside of the exterior resin.

The anode lead terminal has a Cu base material, and an Au-plating layer formed in a predetermined region on the Cu base material so as to form a surface layer of the anode lead terminal. A surface of the anode lead terminal has an Au region where the Au-plating layer forms a surface layer, and a Cu region where the Au-plating layer is not formed and Cu is exposed.

The cathode lead terminal has a base material, and an Au-plating layer formed on the base material so as to form a surface layer of the cathode lead terminal. The anode section of the capacitor element is connected to the Cu region of the anode lead terminal.

Preferably, the Cu region of the anode lead terminal is located at the inside from the outer edge of the exterior resin.

Preferably, the anode section of the capacitor element and the Cu region of the anode lead terminal are bonded to each other by resistance welding.

An electronic component module according to the present invention includes the solid electrolytic capacitor, and a circuit board having a land electrode, wherein the anode lead terminal and the cathode lead terminal of the solid electrolytic capacitor are bonded to the land electrode of the circuit board by soldering.

A method for producing a solid electrolytic capacitor according to the present invention includes the steps of providing a plurality of capacitor elements each having an anode section, a dielectric material layer disposed on the anode section, and a cathode section disposed on the dielectric material layer; applying an Au-plating onto a Cu base material to form an anode lead terminal having an Au region, the surface layer of which includes an Au-plating layer, and a Cu region where the Au-plating layer is not formed, and Cu is exposed at the surface; applying an Au-plating onto a base material to form a cathode lead terminal, the surface layer of which includes an Au-plating layer; forming a laminate by stacking the plurality of capacitor elements so as to electrically connect the anode sections of the capacitor element to one another and electrically connect the cathode sections of the capacitor element to one another; connecting the Cu region of the anode lead terminal to the anode section of the capacitor element; connecting the cathode lead terminal to the cathode section of the capacitor element; and forming an exterior resin that covers the laminate such that a part of the anode lead terminal and a part of the cathode lead terminal are drawn to the outside.

Preferably, the laminate is covered so as to ensure that the Cu region of the anode lead terminal is located at the inside from the outer edge of the exterior resin.

Preferably, the anode section of the capacitor element and the Cu region of the anode lead terminal are bonded to each other by resistance welding.

Further preferably, the method also includes forming an oxide film on the Cu region by heating the Cu region of the anode lead terminal.

A method for producing an electronic component module according to the present invention includes the steps of providing a circuit board with solder pastes provided at a plurality of positions; mounting the solid electrolytic capacitor on the circuit board by disposing the anode lead terminal and the cathode lead terminal of the solid electrolytic capacitor on each of the solder pastes provided at a plurality of positions; and firmly fixing the solid electrolytic capacitor to the circuit board by introducing the circuit board, on which the solid electrolytic capacitor is mounted, into a reflow furnace.

In the solid electrolytic capacitor according to the present invention, Au that is not melted at a reflow temperature is used as a plating material for an anode lead terminal, and a Cu region, on which an Au-plating layer is not formed, is provided at an anode lead terminal, so that an anode section of a capacitor element and the anode lead terminal can be reliably bonded to each other. Consequently, a solid electrolytic capacitor excellent in air tightness and weather resistance can be provided.

In the electronic component module according to the present invention, the Au-plating layer or Cu that forms the surface of the anode lead terminal that forms the solid electrolytic capacitor is in contact with the exterior resin, and the Au-plating layer that forms the surface of the cathode lead terminal is in contact with the exterior resin, so that even if the electronic component module is placed under a reflow temperature, adhesion between the exterior resin and the anode lead terminal or cathode lead terminal is secured.

That is, Au that forms the Au-plating layer has a high melting point of 1338° C., so that even if the solid electrolytic capacitor of the present invention is placed under a reflow temperature, there is no possibility that the plating layer is melted. Therefore, adhesion between the exterior resin and the anode lead terminal and cathode lead terminal is secured, so that air tightness and weather resistance can be improved.

In the method for producing a solid electrolytic capacitor according to the present invention, an Au-plating that is not melted at a reflow temperature is used as a plating material for the anode lead terminal, while a Cu region, on which an Au-plating layer is not formed, is provided at the anode lead terminal, and therefore the anode section of the capacitor element and the anode lead terminal can be reliably bonded to each other. As a result, a solid electrolytic capacitor excellent in air tightness and weather resistance can be reliably produced.

According to the method for producing an electronic component module according to the present invention, an electronic component module having high reliability can be produced while efficient production method, i.e. reflow soldering is employed.

DETAILED DESCRIPTION OF THE INVENTION (Solid Electrolytic Capacitor)

Figure 1A:
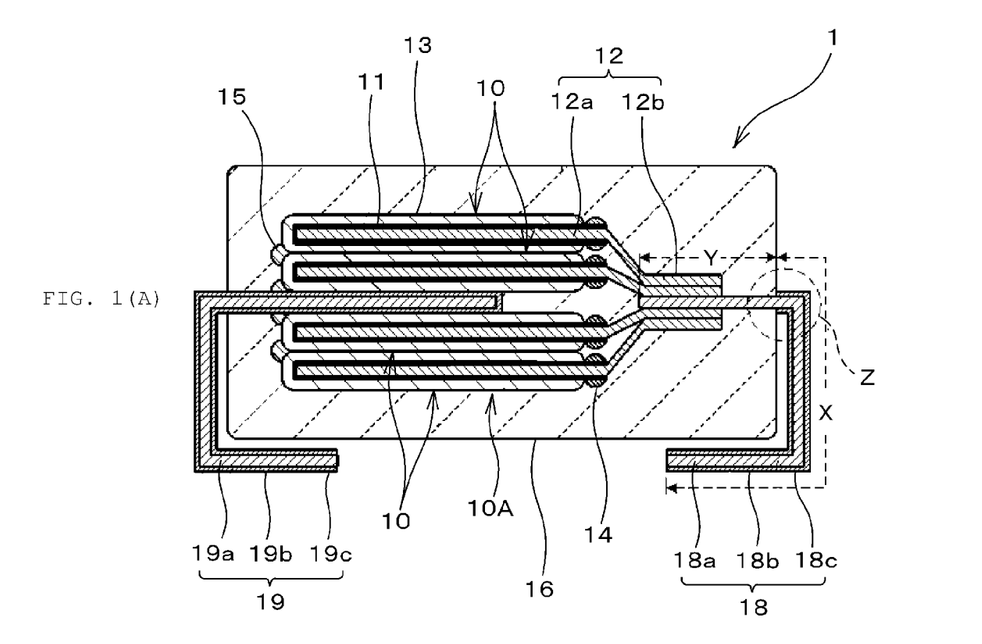
FIG. 1(A) is a sectional view of a solid electrolytic capacitor according to an embodiment of the present invention.

As shown in FIG. 1(A), a solid electrolytic capacitor 1 according to this embodiment includes a plurality of capacitor elements 10 (four capacitor elements in the configuration in FIG. 1(A)) each having a dielectric material section 11, an anode section 12 and a cathode section 13; an anode lead terminal 18 connected to the anode section 12; a cathode lead terminal 19 connected to the cathode section 13; and an exterior resin 16 covering a laminate 10A formed by laminating the plurality of capacitor elements 10.

Figure 2:
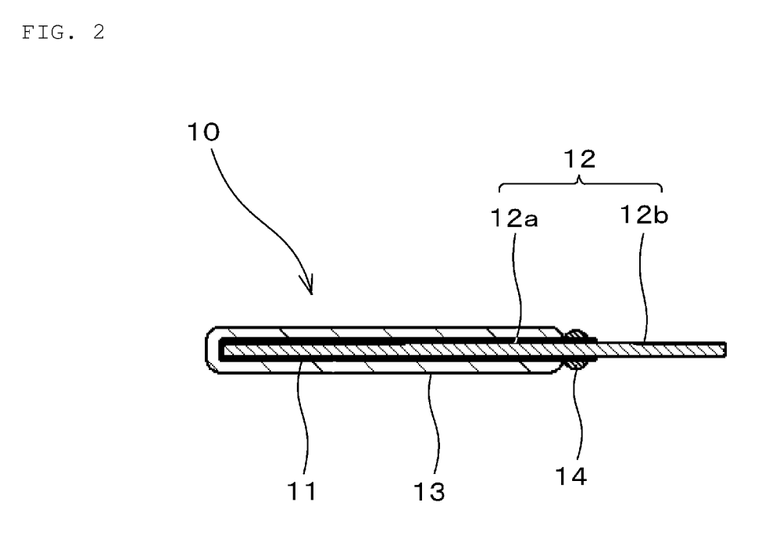
FIG. 2 is a view showing a capacitor element in the solid electrolytic capacitor shown in FIG. 1.

As shown in FIGS. 1(A) and 2, the capacitor element 10 includes the anode section 12 including a valve action metal substrate; the dielectric material section 11 (shown with a bold line in the figure) formed on a surface of the anode section 12; and the cathode section 13 formed on a part of the dielectric material section 11.

The anode section 12 includes an anode section body 12a located at a capacitance generation region of the capacitor element 10; and an anode drawing section 12b drawn from the anode section body 12a to the outside of the capacitance generation region. Examples of the material of the anode section 12 include aluminum, tantalum and niobium. The surface of the anode section 12 is etched to be roughened. In this embodiment, an aluminum foil having a thickness of 20 µm to 300 µm is used as the anode section 12. The dielectric material section 11 is a dielectric material film formed by oxidizing the roughened surface of the anode section 12. The thickness of the dielectric material film is, for example, 5 nm to 100 nm.

The cathode section 13 includes a composite layer with a conductive polymer layer, a carbon paste layer and an Ag paste layer formed in this order. The conductive polymer layer, the carbon paste layer and the Ag paste layer are formed by adding their respective raw material solutions.

A blocking member 14 is provided between the cathode section 13 and the anode drawing section 12b. The blocking member 14 is intended for blocking a raw material solution in formation of the cathode section 13 so that the raw material solution does not enter the anode drawing section 12b. The blocking member 14 is formed of, for example, an insulating resin having an electrical insulating property.

The plurality of capacitor elements 10 that form the laminate 10A are laminated so as to electrically connect the anode drawing sections 12b of mutually adjacent anode sections 12 to each other and electrically connect mutually adjacent cathode sections 13 to each other. In this manner, the laminate 10A is formed. The cathode sections 13 of the capacitor elements 10 are connected to one another by a conductive adhesive 15, and the anode drawing sections 12b are bonded to one another by resistance welding as described later. The dielectric material film formed on the surface of the anode drawing section 12b is broken in resistance welding, so that the anode sections 12 are electrically connected to one another.

The laminate 10A formed by laminating a plurality of capacitor elements 10 is covered with the exterior resin 16 having an electrical insulating property. The material of the exterior resin 16 is, for example, an epoxy resin.

One end of the anode lead terminal 18 is electrically connected to the anode section 12 of the capacitor element 10, and one end of the cathode lead terminal 19 is electrically connected to the cathode section 13. The other end of the anode lead terminal 18 and the other end of the cathode lead terminal 19 are drawn from the inside to the outside of the exterior resin 16.

The cathode lead terminal 19 has on the surface thereof an Au-plating layer 19c. Specifically, the cathode lead terminal 19 has a Cu base material 19a, a Ni-plating layer 19b is formed on the Cu base material 19a, and thereon is further formed the Au-plating layer 19c that forms the surface layer of the cathode lead terminal 19. Formation of the Ni-plating layer 19b as a ground is intended to prevent corrosion of the Cu base material 19a and suppress diffusion of the Au-plating layer 19c as the uppermost layer to the Cu base material 19a. The thickness of the Cu base material 19a is, for example, 100 μm, the thickness of the Ni-plating layer 19b is, for example, 5 μm, and the thickness of the Au-plating layer 19c is, for example, 0.1 μm. One end of the cathode lead terminal 19 is connected to the cathode section 13 of the capacitor element 10 by the conductive adhesive 15.

Figure 1B:
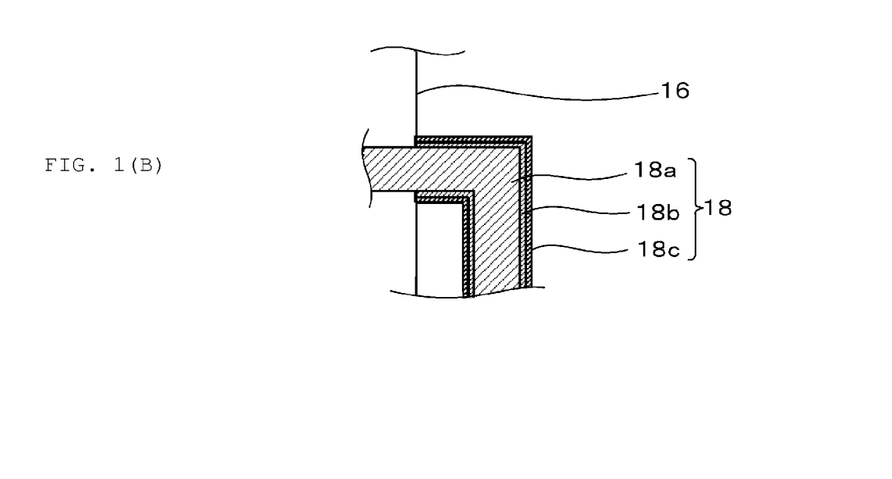
FIG. 1(B) is an enlarged view of the Z part in FIG. 1(A)

The anode lead terminal 18 has a Cu base material 18a formed of the same material as that of the cathode lead terminal 19. It is to be noted that as shown in FIGS. 1(A) and 1(B), the surface of the anode lead terminal 18 has an Au region X where the Au-plating layer 18c is formed as a surface layer, and a Cu region Y where the Au-plating layer 18c is not formed. Specifically, the anode lead terminal 18 in the Au region X has the Ni-plating layer 18b formed on the Cu base material 18a, and the Au-plating layer 18c as a surface layer further formed thereon. The thickness of each of the Cu base material 18a, the Ni-plating layer 18b and the Au-plating layer 18c is similar to that of the cathode lead terminal 19. On the other hand, the Cu region Y of the anode lead terminal 18 is a region where a plating layer is not formed on the Cu base material 18a, and the Cu base material 18a itself is exposed. The Cu region Y is disposed at the inside of the exterior resin 16, and connected to the anode section 12 of the capacitor element 10.

The solid electrolytic capacitor 1 in this embodiment is featured in that the surface of a part of the anode lead terminal 18 has the Cu region Y. Since the Cu region Y is provided, the electric resistance between the anode lead terminal 18 in the Cu region Y and the anode section 12 of the capacitor element 10 can be increased at the time of resistance-welding the anode lead terminal 18 and the capacitor element 10 to each other. When the electric resistance is increased, heat is easily generated in the members to be mutually bonded (the anode section 12 and the Cu region Y of the anode lead terminal 18), so that the members can be bonded by resistance welding in which a part of one or both of the members is melted to bond the members.

Table 1 shows the electric resistance at the time of superimposing each of several materials on an aluminum foil.

TABLE 1

| Materials | Electric resistance (mΩ) |
|---|---|
| Cu base material | 4.4 |
| Sn-plating article | 1.3 |
| Au-plating article | 0.5 |

Measurement of the electric resistance was performed by superimposing each of samples 1 to 3 on an aluminum foil as one example of the anode section 12, sandwiching both sides thereof between a pair of welding electrodes, and applying a predetermined alternating-current voltage (10 V, 100 mA, 20 kHz) thereto. E4980 manufactured by Agilent Technologies was used as a measurement device, and 2323A manufactured by Agilent Technologies was used as a test lead.

As shown in Table 1, the Cu base material has a higher electric resistance as compared to Sn-plated and Au-plated Cu base materials. Therefore, it is apparent that Cu is suitable as a material to be used for resistance welding to the anode section 12 of the capacitor element 10.

In this embodiment, the Cu base material 19a as a base material is used for the cathode lead terminal 19, but since the cathode lead terminal 19 is connected to the cathode section 13 by the conductive adhesive 15 rather than a resistance welding method, the base material is not necessarily required to be the Cu base material 19a as in this embodiment, and one formed of other material can be used. The cathode lead terminal is not bonded to the cathode section 13 by a resistance welding method, and therefore is not required to have a Cu region, unlike in the case of the anode lead terminal.

As shown in FIG. 1(A), the length of the Cu region Y in the anode lead terminal 18 of the solid electrolytic capacitor 1 is equal to the distance between one end of the anode lead terminal 18 and the outer edge of the exterior resin 16.

On the other hand, the length of the Au region X is equal to the distance between the other end of the anode lead terminal 18 and the outer edge of the exterior resin 16.

When the material of the exterior resin 16 is, for example, an epoxy resin, the exterior resin 16 has higher adhesion to the Cu base material 18a than to the Au-plating layer 18c. Therefore, by covering the whole of the Cu region Y with the exterior resin 16, adhesion between the anode lead terminal 18 and the exterior resin 16 can be made as high as possible.

In this embodiment, for securing resistance to a reflow temperature at which an electronic component module 2 (see FIG. 7) including the solid electrolytic capacitor 1 is caused to reflow, a Cu base material is used as a base material of the anode lead terminal 18 and the cathode lead terminal 19, and Ni and Au are used as plating materials to be applied to the Cu base materials 18a and 19a.

That is, when the electronic component module 2 including the solid electrolytic capacitor 1 is caused to reflow, the general reflow temperature is 235° C. to 260° C., and a material having a melting point higher than the reflow temperature should be used as a plating material.

Thus, in this embodiment, as described above, Ni having a melting point of 1455° C. is used to form Ni-plating layers 18b and 19b as ground plating layers, and Au having a melting point of 1338° C. is used to form Au-plating layers 18c and 19c as surface layer plating layers.

Accordingly, even if the solid electrolytic capacitor 1 according to this embodiment is placed under a reflow temperature, there is no possibility that the plating layers are melted. Therefore, adhesion between the exterior resin 16 and the anode lead terminal 18 or cathode lead terminal 19 can be secured, so that the solid electrolytic capacitor 1 excellent in weather resistance and the electronic component module 2 using the solid electrolytic capacitor 1 can be obtained.

As described above, according to this embodiment, Ni and Au that are not melted at a reflow temperature are used as a plating material for the anode lead terminal 18, while a part of the anode lead terminal 18 is the Cu region Y suitable for resistance welding, and therefore the anode section 12 of the capacitor element 10 and the anode lead terminal 18 can be reliably bonded to each other by a resistance welding method.

A region of the anode lead terminal 18, which is covered with (embedded in) the exterior resin 16, is a region (Cu region Y) where the Cu base material is exposed, and therefore adhesion between the exterior resin 16 and the anode lead terminal 18 is sufficiently secured. As a result, it becomes possible to reduce the distance between the outer edge of the exterior resin 16 and the capacitor element 10, i.e. reduce the wall thickness of the exterior resin 16, so that the solid electrolytic capacitor 1 can be downsized.

The surface layers of the other end of the anode lead terminal 18 and the other end of the cathode lead terminal 19 are Au-plating layers 18c and 19c, and therefore solder bondability in reflow soldering can be improved. Further, the surface layer of one end of the cathode lead terminal 19 is the Au-plating layer 19c, and therefore adhesion and electrical conductivity between one end of the cathode lead terminal 19 and the Ag paste layer as the outermost layer of the cathode section 13 can be improved.

The constituent material of the plating layer (ground layer) formed between the Cu base materials 18a and 19a and the Au-plating layers 18c and 19c is not limited as long as it is a material which is excellent in adhesion with Cu (Cu base material) and Au (Au-plating layer) and has a melting point higher than a reflow temperature, and a material other than Ni can be used. For example, a Ni/Pd-plating layer may be formed in place of Ni-plating layers 18b and 19b (melting point of Pd: 1555° C.)

The Cu region Y of the anode lead terminal 18 is not limited to a region where the Cu base material 18a is exposed, and the Cu region Y may be a region where a Cu-plating is further applied onto the Cu base material 18a.

The melting point of Cu as a base material of the cathode lead terminal 19 and the anode lead terminal 18 is 1064° C., the heat resistance temperature of the capacitor element 10 is 660° C., and the heat resistance temperature of the epoxy resin as a material of the exterior resin 16 is 260 to 350° C., each of the temperatures being higher than the reflow temperature. Therefore, the solid electrolytic capacitor 1 in this embodiment has sufficient heat resistance.

Figure 3:
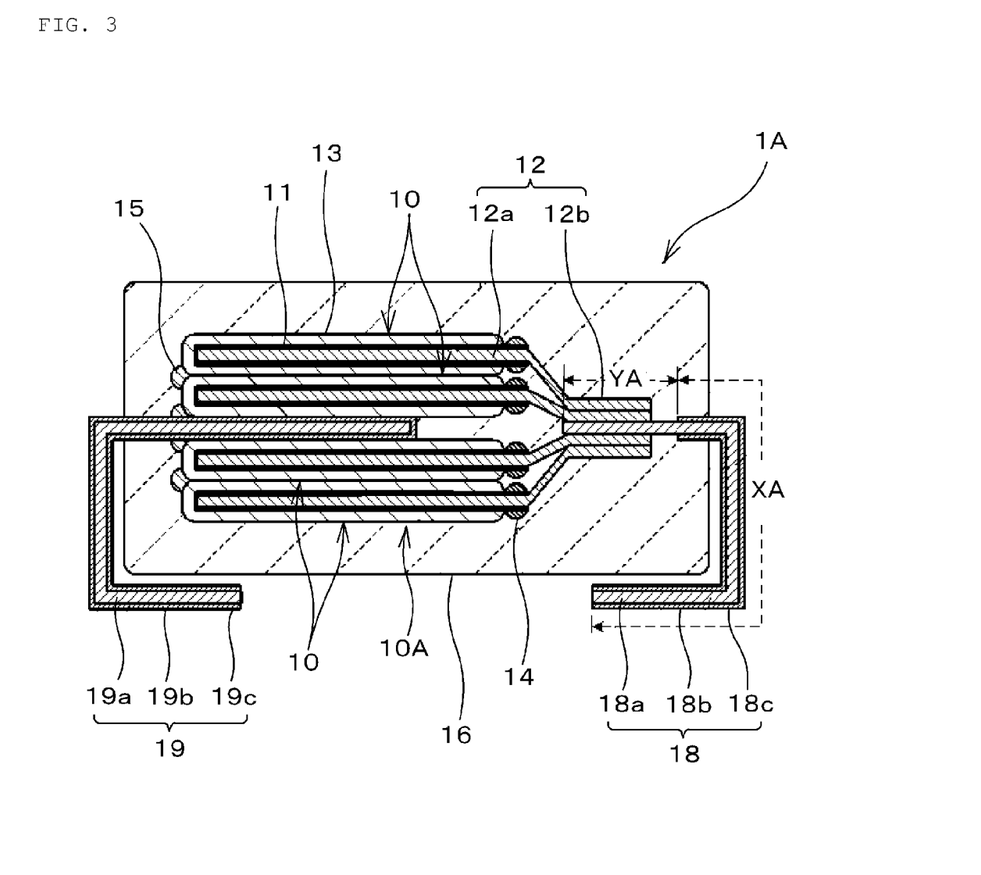
FIG. 3 is a view showing a modification of the solid electrolytic capacitor shown in FIG. 1.

FIG. 3 is a view showing a modification of the solid electrolytic capacitor 1. A solid electrolytic capacitor 1A shown in FIG. 3 is featured in that an Au region XA extends to the inside from the outer edge of the exterior resin 16. Constituent elements that are the same as those of the solid electrolytic capacitor 1 in FIG. 1 are given the same numbers and descriptions thereof are omitted.

As shown in FIG. 3, the length of a Cu region YA in the modification is smaller than the distance between one end of an anode lead terminal 18A and the outer edge of the exterior resin 16. On the other hand, the length of the Au region XA is greater than the distance between the other end of the anode lead terminal 18A and the outer edge of the exterior resin 16. Accordingly, the whole of the Cu region YA can be reliably covered with the exterior resin 16. Therefore, the Cu region YA of the anode lead terminal 18A can be prevented from coming into contact with the open air to suppress occurrence of corrosion, rust and the like.

(Method for Producing Solid Electrolytic Capacitor)

A method for producing the solid electrolytic capacitor 1 will be described with reference to FIGS. 4(A) to 4(D), FIGS. 5(A) to 5(D) and FIG. 6. The method for producing the solid electrolytic capacitor 1 includes at least a capacitor element providing step; an anode lead terminal forming step; a cathode lead terminal forming step; a laminate forming step of forming a laminate by stacking capacitor elements; an anode connecting step; a cathode connecting step; and an exterior resin forming step.

Figure 4A:
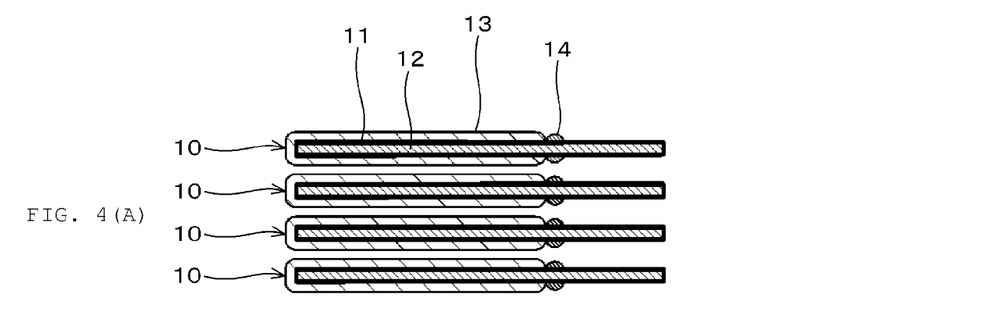
FIGS. 4(A) to 4(D) are views for explaining a part of a method for producing the solid electrolytic capacitor shown in FIG. 1, i.e. a capacitor element providing step, a lead terminal providing step, a cathode terminal forming step and an anode terminal forming step.

FIG. 4(A) is a view for explaining the capacitor element providing step. The capacitor element providing step is a step of providing a plurality of capacitor elements 10 each having a dielectric material section 11, an anode section 12, a cathode section 13, a heat insulating member (insulating resin) 14. In FIG. 4(A), four capacitor elements 10 are shown. At this time, the dielectric material film (dielectric material section) 11 is formed on the whole of the surface of the anode section 12.

Figure 4B:
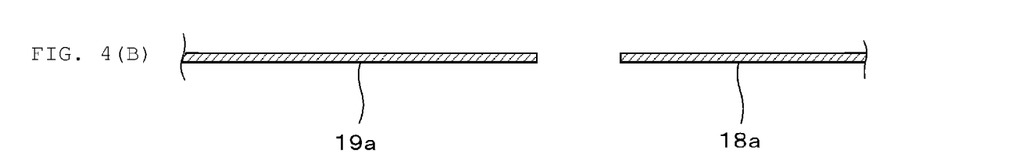
Figure 4C:
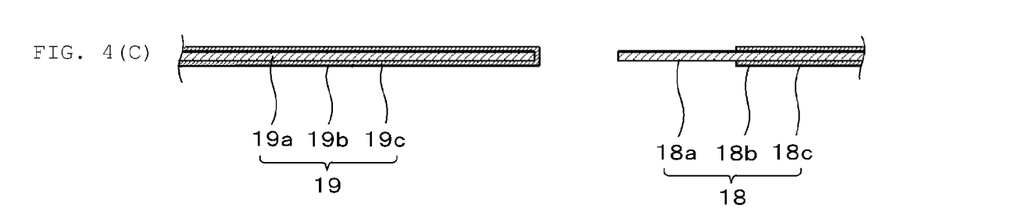

FIGS. 4(B) and 4(C) are views for explaining the anode lead terminal forming step and the cathode lead terminal forming step.

For forming the anode lead terminal and the cathode lead terminal, first a Cu base material 18a for an anode lead terminal and a Cu base material 19a for a cathode lead terminal are provided as shown in FIG. 4(B). The Cu base materials 18a and 19a may be provided as one united body by punching, for example, a belt-shaped hoop material.

The anode lead terminal 18 is formed by applying an Au-plating to a predetermined region of the surface of the Cu base material 18a for the anode lead terminal 18 as shown in FIG. 4(C). Consequently, the anode lead terminal is prepared which has an Au region X, the surface layer of which includes the Au-plating layer 18c, and a Cu region Y where the Au-plating layer 18c is not formed, and Cu is exposed at the surface.

Specifically, the anode lead terminal is prepared by, for example, masking a region of the Cu base material 18a, which forms the Cu region Y, then applying a Ni-plating to form a Ni-plating layer that forms a ground layer, and applying an Au-plating onto the Ni-plating layer to form an Au-plating layer that forms a surface layer (uppermost layer), followed by removing the masking material. In the anode lead terminal 18, the masked region is the Cu region Y, and the region which is not masked and has an Au-plating layer formed on a Ni-plating layer is the Au region X.

The cathode lead terminal 19 is prepared by applying an Au-plating to the surface of the Cu base material 19a for the cathode lead terminal 19 as shown in FIG. 4(C).

Specifically, the cathode lead terminal is prepared by, for example, applying a Ni-plating onto the Cu base material 19a to form a Ni-plating layer that forms a ground layer, and applying an Au-plating onto the Ni-plating layer to form an Au-plating layer that forms a surface layer (uppermost layer).

The cathode lead terminal forming step and the anode lead terminal forming step can be carried out in parallel. For example, a scheduled area of the Cu base material 18a, which forms the Cu region Y, is masked, and a Ni-plating is applied to the Cu base material 18a and the Cu base material 19a in parallel, followed by applying an Au-plating onto the Ni-plating layers in parallel.

Figure 4D:
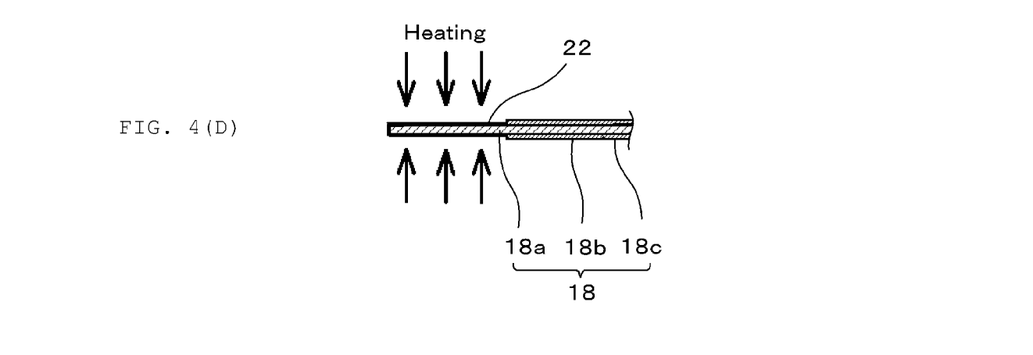

The anode lead terminal forming step may include an oxide film forming step of forming an oxide film 22 on the Cu region Y as shown in FIG. 4(D). The oxide film 22 is formed on the Cu region Y (i.e. an exposed surface of the Cu base material 18a) by heating the Cu region Y of the anode lead terminal 18 in the air at, for example, 100° C. to 200° C. The thickness of the oxide film 22 is, for example, 2 nm to 45 nm.

Due to the presence of the oxide film 22, the electrical resistance becomes higher at the time of bonding the anode lead terminal 18 and the anode section 12 of the capacitor element 10. Therefore, the temperature at the bonding area can be intensively increased, so that resistance welding described later can be more reliably performed.

Figure 5A:
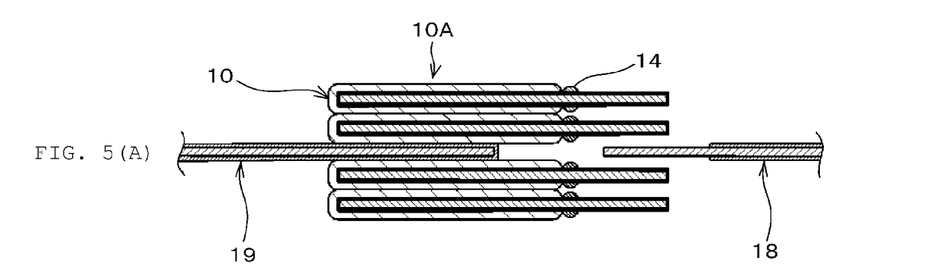
FIGS. 5(A) to 5(D) are views for explaining the remaining part of the method for producing the solid electrolytic capacitor shown in FIG. 1, i.e. a capacitor element stacking step, a cathode connecting step, an anode connecting step and an exterior resin forming step which are carried out after the steps shown in FIGS. 4(A) to 4(D)

FIG. 5(A) is a view for explaining the laminate forming step of forming a laminate by stacking capacitor elements. The laminate forming step is a step of forming a laminate 10A by stacking a plurality of capacitor elements 10 so as to electrically connect the anode sections 12 of the capacitor elements 10 to one another and electrically connect the cathode sections 13 of the capacitor elements 10 to one another. In FIG. 5(A), a plurality of capacitor elements 10 are laminated so as to sandwich the anode lead terminal 18 and the cathode lead terminal 19.

Figure 5B:
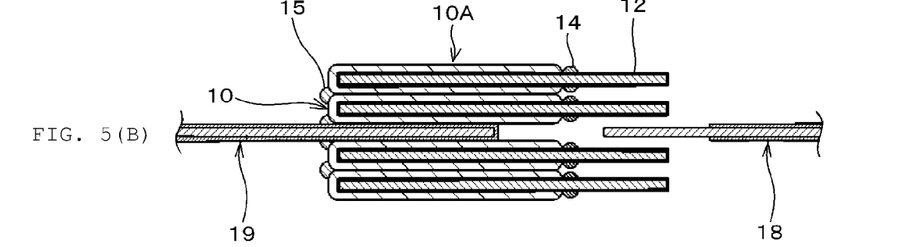

FIG. 5(B) is a view for explaining the cathode connecting step. The cathode connecting step is a step of connecting the cathode lead terminal 19 to the cathode section 13 of the capacitor element 10. One end of the cathode lead terminal 19 and the cathode section 13 of the capacitor element 10 are connected to each other by the conductive adhesive 15 such as an Ag paste.

Figure 5C:
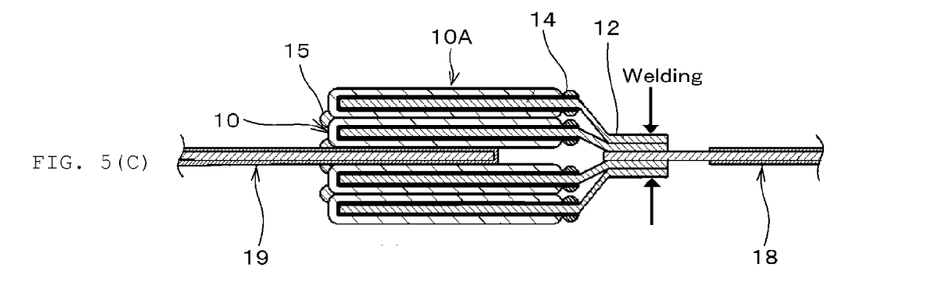

FIG. 5(C) is a view for explaining the anode connecting step. The anode connecting step is a step of connecting the Cu region Y of the anode lead terminal 18 to the anode section 12 of the capacitor element 10. The Cu region Y of the anode lead terminal 18 and the anode section 12 of the capacitor element 10 are bonded to each other by resistance welding. The anode drawing section 12b of each anode section 12 is bent toward the anode lead terminal 18, and then bonded. The dielectric material film formed on the surface of the anode drawing section 12b is removed in the step of resistance welding. Conditions for resistance welding include, for example, an electric power of 0.4 kw to 2.0 kw and an electric power application time of 5 ms to 40 ms.

Figure 6:
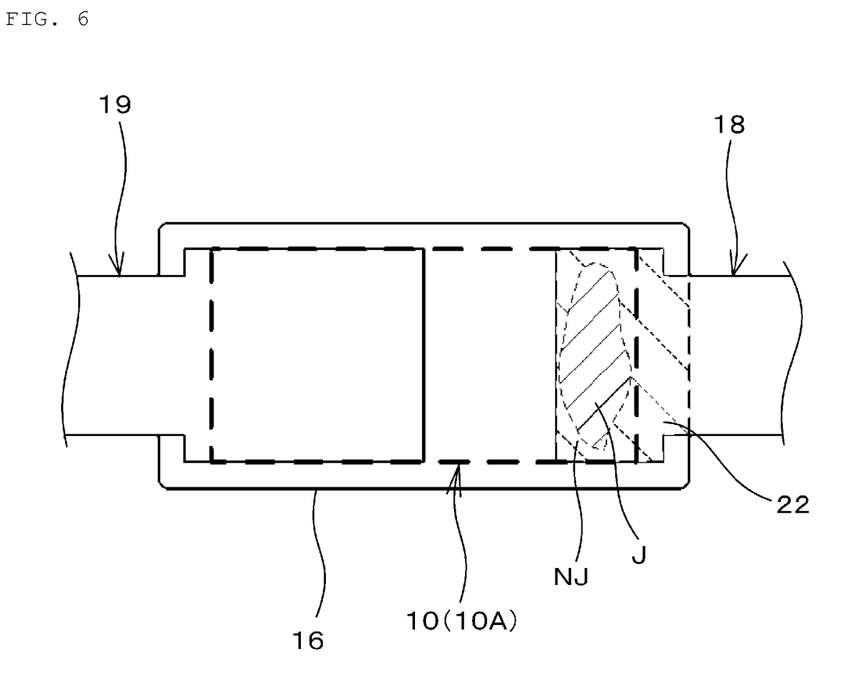
FIG. 6 is a view two-dimensionally showing a resistance-welded area in the anode connecting step shown in FIG. 5(C)

FIG. 6 is a view two-dimensionally showing a resistance-welded part in the anode connecting step. In FIG. 6, a bonding region J of the Cu region Y, which is resistance-welded, is shown in the form of a nugget shape. When the oxide film 22 is formed on the surface of the Cu region Y in the oxide film forming step in the anode lead terminal forming step, the oxide film 22 is broken during resistance welding to establish electrical conduction to the anode section 12 of the capacitor element 10. On the other hand, the oxide film 22 remains on a non-bonding region NJ which is not resistance-welded.

The anode connecting step may be carried out before or after the cathode connecting step.

Figure 5D:
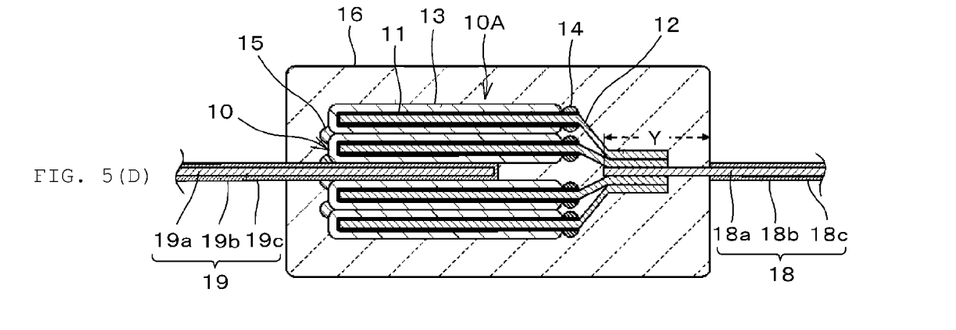

FIG. 5(D) is a view for explaining the exterior resin forming step. The exterior resin forming step is a step of forming the exterior resin 16 so as to cover (seal) the laminate 10A formed by laminating a plurality of capacitor elements 10. The exterior resin 16 is formed by, for example, injection molding. At this time, the exterior resin 16 is formed such that the Cu region Y of the anode lead terminal 18 is located at the inside of the exterior resin 16 (i.e. the Cu region Y is embedded in the exterior resin 16).

After the exterior resin 16 is formed, the other ends of the cathode lead terminal 19 and the anode lead terminal 18 are cut, and bending molding is performed to produce the solid electrolytic capacitor 1.

(Electronic Component Module)

Figure 7:
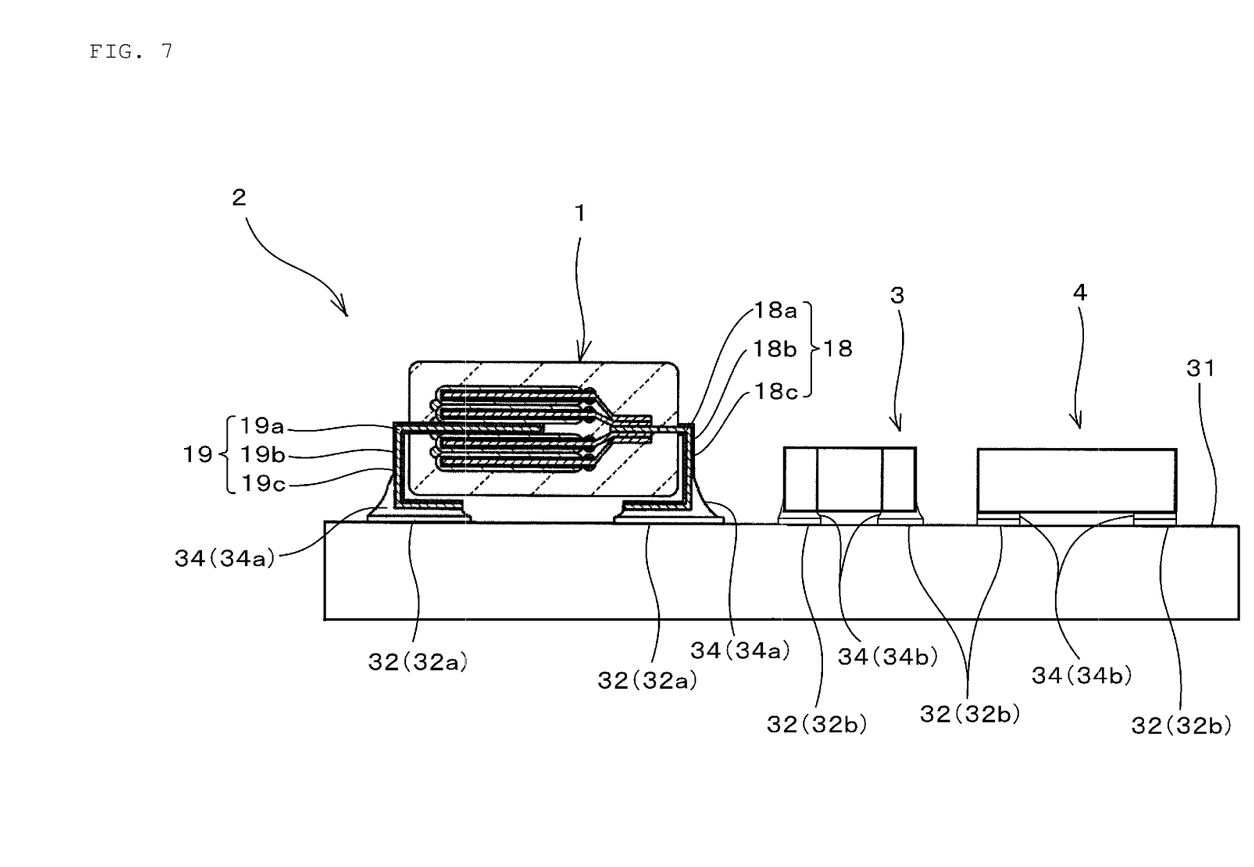
FIG. 7 is a sectional view of an electronic component module including the solid electrolytic capacitor shown in FIG. 1.

FIG. 7 is a view showing an electronic component module 2 including the solid electrolytic capacitor 1. The electronic component module 2 includes the solid electrolytic capacitor 1; other surface mounting type electronic components 3 and 4; and a circuit board 31 having land electrodes 32 (32a and 32b). The anode lead terminal 18 and cathode lead terminal 19 of the solid electrolytic capacitor 1 are bonded to the land electrode 32 (32a) of the circuit board 31 by a solder 34 (34a), and other surface mounting type electronic components 3 and 4 are bonded to the other land electrode 32 (32b) by a solder 34 (34b).

The electronic component module 2 is, for example, a power supply circuit.

A predetermined circuit patterns (not illustrated) or land electrodes 32 (32a and 32b) that form a part of the circuit pattern are formed on the circuit board 31. The land electrodes 32 (32a and 32b) are intended for electrically connecting the circuit pattern of the circuit board 31 to the solid electrolytic capacitor 1 or other surface mounting type electronic components 3 and 4.

As the solder 34 for bonding the anode lead terminal 18 and cathode lead terminal 19 of the solid electrolytic capacitor 1 to the land electrode 32a, one formed of a composition of Sn, Ag, Cu and the like, for example, can be used. In the solder 34a, Au originating from Au-plating layers 18c and 19c formed on the surfaces of the anode lead terminal 18 and the cathode lead terminal 19 is melted, and Au components exist. Areas of the anode lead terminal 18 and the cathode lead terminal 19, which are in contact with the solder 34a, are Ni-plating layers 18b and 19b rather than Au-plating layers 18c and 19c.

In this way, a part of the Au-plating layer formed on the surfaces of the anode lead terminal 18 and the cathode lead terminal 19 is melted into the solder 34a through reflow soldering and removed. However, since the solder 34a is not in contact with the anode lead terminal 18 and the cathode lead terminal 19 located at the inside of the exterior resin 16, and the melting point of Au is higher than the reflow temperature, Au-plating layers 18c and 19C are not melted. Consequently, adhesion between the exterior resin 16 and the anode lead terminal 18 or cathode lead terminal 19 is secured to improve weather resistance of the solid electrolytic capacitor 1, so that the electronic component module 2 having high reliability can be obtained.

(Method for Producing Electronic Component Module)

A method for producing the electronic component module 2 will be described with reference to FIGS. 8(A) to 8(C). The method for producing the electronic component module 2 in this embodiment includes a circuit board providing step, a mounting step of mounting the solid electrolytic capacitor 1, and a reflow soldering step.

Figure 8A:
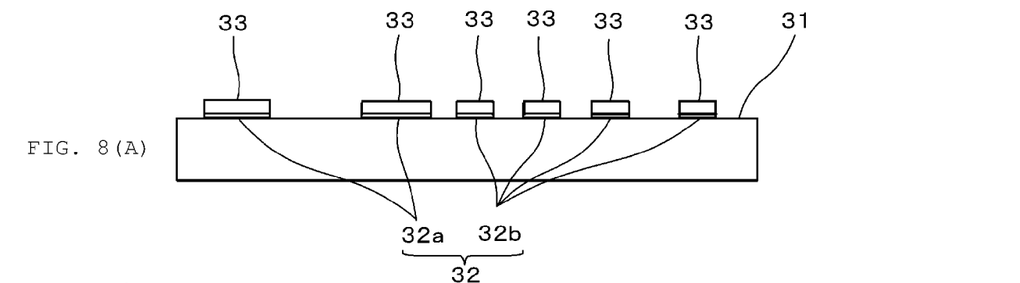
FIGS. 8(A) to 8(C) are views for explaining a method for producing the electronic component module shown in FIG. 7.

In the circuit board providing step, a circuit board 31 having a plurality of solder pastes 33 are provided as shown in FIG. 8(A). By printing a solder paste using a screen printing method etc., the solder paste 33 is formed on the land electrode 32 (32a) formed on the circuit board 31. The solder paste is, for example, a solder paste formed of a eutectic composition of Sn, Ag, Cu and the like.

Figure 8B:
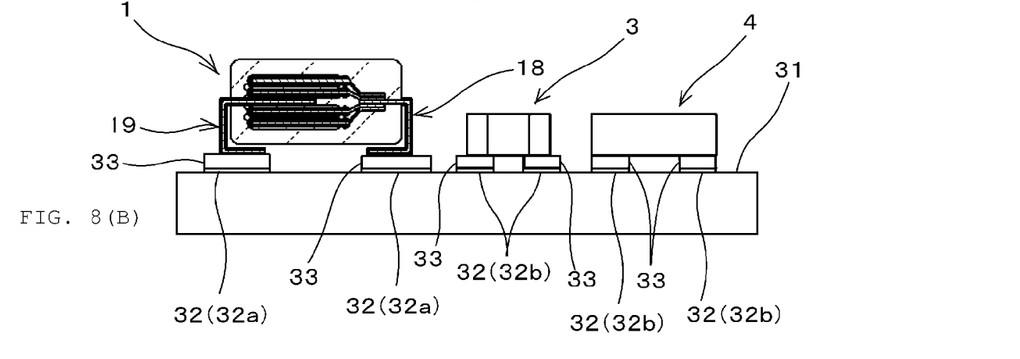

In the mounting step, the solid electrolytic capacitor 1 is mounted on the circuit board 31 by disposing the anode lead terminal 18 and cathode lead terminal 19 of the solid electrolytic capacitor 1 on each of the plurality of solder pastes 33 as shown in FIG. 8(B). Mounting of the solid electrolytic capacitor 1 can be performed using a known mounter etc.

At this time, other surface mounting type electronic components 3 and 4 are also placed on the land electrode 32 (32b) with the solder paste 33 interposed therebetween.

Figure 8C:
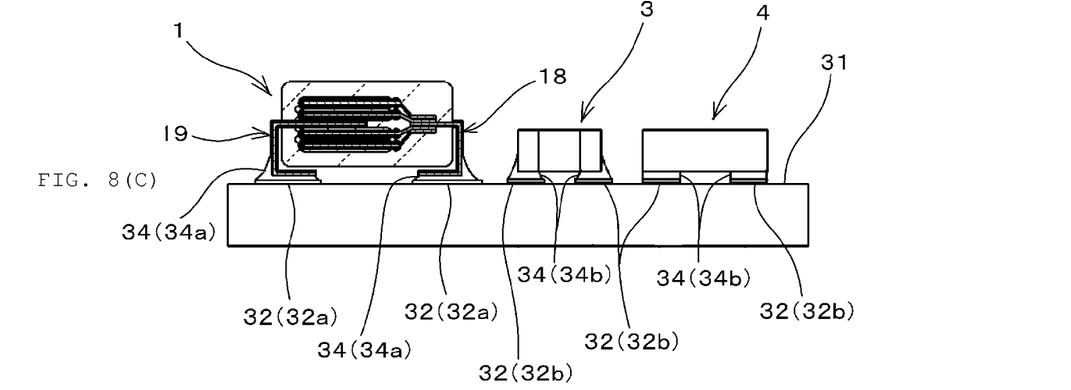

In the reflow soldering step, the circuit board 31 on which the solid electrolytic capacitor 1 is mounted is introduced into a reflow furnace (not illustrated) to firmly fix the solid electrolytic capacitor 1 to the circuit board 31 as shown in FIG. 8(C). The reflow temperature is set to 235° C. to 260° C.

The electronic component module 2 including the solid electrolytic capacitor 1 is produced by passing through the above-mentioned steps.

As described above, the Au-plating layers 18c and 19c are formed on the surfaces of the anode lead terminal 18 and cathode lead terminal 19 of the solid electrolytic capacitor 1 included in the electronic component module 2. Since the melting point of Au that forms the Au-plating layers 18c and 19c is higher than the reflow temperature, the Au-plating layers 18c and 19c are not melted at the inside of the exterior resin 16 in the reflow step. As a result, the electronic component module 2 having high weather resistance and reliability can be produced while efficient production method, i.e. reflow soldering is employed.

This embodiment is not intended to limit the invention as set forth in claims, and various modifications can be made as long as they have an identical technical concept. For example, the number of capacitor elements included in the solid electrolytic capacitor is not limited to 4, and may be any number of 2 or greater. In the embodiment described above, a solid electrolytic capacitor having a configuration in which the anode drawing section of the capacitor element is disposed so as to sandwich the anode lead terminal from both sides has been shown, but a configuration is also possible in which the anode drawing section of the capacitor element is laminated only on one side of the anode lead terminal. In this case, the Cu region may be formed only on a surface (one surface) that faces the anode lead terminal.

What is claimed is:

1. A solid electrolytic capacitor comprising:
a laminate with a plurality of capacitor elements each having an anode section, a dielectric material layer on the anode section, and a cathode section on the dielectric material layer, the anode sections being electrically connected to one another and the cathode sections being electrically connected to one another;
a resin covering the laminate;
an anode lead terminal electrically connected to the anode section of the capacitor element and outward from the resin; and
a cathode lead terminal electrically connected to the cathode section of the capacitor element and outward from the resin, wherein
the anode lead terminal comprises a Cu base material, and a first Au-plating layer in a predetermined region on the Cu base material such that a surface of the anode lead terminal has an Au region covered by the first Au-plating layer, and a Cu region where the first Au-plating layer is not present and the Cu base material is exposed,
the cathode lead terminal comprises a base material, and a second Au-plating layer on the base material of the cathode lead terminal, and
the anode section of the capacitor element is connected to the Cu region of the anode lead terminal.

2. The solid electrolytic capacitor according to claim 1, wherein the Cu region of the anode lead terminal is located within the resin.

3. The solid electrolytic capacitor according to claim 1, wherein the anode section of the capacitor element and the Cu region of the anode lead terminal are bonded to each other by resistance welding.

4. The solid electrolytic capacitor according to claim 1, further comprising a blocking member between the cathode section and the anode section.

5. The solid electrolytic capacitor according to claim 1, wherein the cathode sections are connected to each other by a conductive adhesive.

6. The solid electrolytic capacitor according to claim 1, wherein the resin is an epoxy resin.

7. The solid electrolytic capacitor according to claim 1, further comprising a first Ni-plating layer between the first Au-plating layer and the Cu base material of the anode lead terminal.

8. The solid electrolytic capacitor according to claim 7, further comprising a second Ni-plating layer between the second Au-plating layer and the base material of the cathode lead terminal.

9. The solid electrolytic capacitor according to claim 1, further comprising a Ni-plating layer between the second Au-plating layer and the base material of the cathode lead terminal.

10. The solid electrolytic capacitor according to claim 1, wherein the base material of the cathode lead terminal is Cu.

11. An electronic component module comprising:
the solid electrolytic capacitor according to claim 1; and
a circuit board having a land electrode, wherein
the anode lead terminal and the cathode lead terminal of the solid electrolytic capacitor are bonded to the land electrode of the circuit board.

12. A method for producing the electronic component module, the method comprising:
providing a circuit board with solder pastes provided at a plurality of positions;
mounting the solid electrolytic capacitor according to claim 1 on the circuit board by disposing the anode lead terminal and the cathode lead terminal of the solid electrolytic capacitor on each of the solder pastes provided at the plurality of positions; and
fixing the solid electrolytic capacitor to the circuit board by introducing the circuit board, on which the solid electrolytic capacitor is mounted, into a reflow furnace.

13. A method for producing a solid electrolytic capacitor, the method comprising:
providing a plurality of capacitor elements each having an anode section, a dielectric material layer disposed on the anode section, and a cathode section disposed on the dielectric material layer;
applying a first Au-plating layer onto a Cu base material to form an anode lead terminal having an Au region which includes the first Au-plating layer, and a Cu region where the Au-plating layer is not located and Cu is exposed at the surface thereof;

applying a second Au-plating layer onto a base material to form a cathode lead terminal;

forming a laminate by stacking the plurality of capacitor elements so as to electrically connect the anode sections of the capacitor element to one another and electrically connect the cathode sections of the capacitor element to one another;

connecting the Cu region of the anode lead terminal to the anode section of the capacitor element;

connecting the cathode lead terminal to the cathode section of the capacitor element; and covering the laminate with a resin such that a part of the anode lead terminal and a part of the cathode lead terminal are not covered by the resin.

14. The method for producing a solid electrolytic capacitor according to claim 13, wherein the Cu region of the anode lead terminal is covered by the resin.

15. The method for producing a solid electrolytic capacitor according to claim 13, wherein the anode section of the capacitor element and the Cu region of the anode lead terminal are bonded to each other by resistance welding.

16. The method for producing a solid electrolytic capacitor according to claim 15, further comprising forming an oxide film on the Cu region by heating the Cu region of the anode lead terminal.

* * * * *